US009542262B1

(12) United States Patent
Bar et al.

(10) Patent No.: US 9,542,262 B1
(45) Date of Patent: Jan. 10, 2017

(54) ERROR CORRECTION

(71) Applicant: AVAGO TECHNOLOGIES GENERAL IP (SINGAPORE) PTE. LTD., Yishun (SG)

(72) Inventors: Ilan Bar, Kiriat Motzkin (IL); Hanan Weingarten, Herzelia (IL)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 257 days.

(21) Appl. No.: 14/290,848

(22) Filed: May 29, 2014

(51) Int. Cl.
H03M 13/00 (2006.01)
G06F 11/10 (2006.01)
H03M 13/05 (2006.01)

(52) U.S. Cl.
CPC .......... *G06F 11/1004* (2013.01); *H03M 13/05* (2013.01)

(58) Field of Classification Search
CPC ............ H03M 13/152; H03M 13/1525; H03M 13/1545; H03M 13/658
See application file for complete search history.

(56) References Cited

U.S. PATENT DOCUMENTS

| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Ranjeet et al. |
| 5,640,529 A | 6/1997 | Hasbun |
| 5,657,332 A | 8/1997 | Auclair et al. |
| 5,663,901 A | 9/1997 | Wallace et al. |
| 5,724,538 A | 3/1998 | Bryg |

(Continued)

FOREIGN PATENT DOCUMENTS

WO    WO2009053963 A2    4/2009

OTHER PUBLICATIONS

NN8804166: "Software-Based Error Control for Personal Systems Communications Links;" IBM Technical Disclosure Bulletin, Apr. 1988; vol. No. 30, Issue Number: 11, p. No. 166-171.*

(Continued)

*Primary Examiner* — Guy Lamarre

(57) ABSTRACT

A method for error correction, the method comprises receiving a codeword that comprises a payload and a redundancy section; error-correction decoding the codeword by applying a syndrome-based error correction process to provide an amended payload and an error-correction decoding success indicator; wherein the amended payload comprises an amended CRC signature and an amended payload data; calculating, using the amended payload CRC signature, a validity of the amended payload to provide a CRC validity result; estimating a number of errors in the redundancy section; and determining that the error-correction succeeded when the number of errors in the redundancy section did not exceed a threshold, the error correction success indicator indicates that the error-correction decoding failed, and the CRC validity result indicates that the amended payload is valid.

25 Claims, 8 Drawing Sheets

(56) References Cited

U.S. PATENT DOCUMENTS

| | | |
|---|---|---|
| 5,729,490 A | 3/1998 | Calligaro et al. |
| 5,740,395 A | 4/1998 | Hasbun |
| 5,745,418 A | 4/1998 | Hu et al. |
| 5,778,430 A | 7/1998 | Giovannetti |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Wallace et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 2001/0034815 A1 | 10/2001 | Dugan et al. |
| 2002/0063774 A1 | 5/2002 | Hillis et al. |
| 2002/0085419 A1 | 7/2002 | Choi |
| 2002/0154769 A1 | 10/2002 | Petersen et al. |
| 2002/0156988 A1 | 10/2002 | Sekibe |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong |
| 2003/0192007 A1 | 10/2003 | Miller et al. |
| 2004/0015771 A1 | 1/2004 | Lasser et al. |
| 2004/0030971 A1 | 2/2004 | Shibata |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Chevallier |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |

(56) References Cited

U.S. PATENT DOCUMENTS

| | | |
|---|---|---|
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0055668 A1* | 3/2011 | Kim .................. H03M 13/152 714/782 |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

(56) References Cited

U.S. PATENT DOCUMENTS

2012/0124273 A1  5/2012  Goss et al.
2012/0246391 A1  9/2012  Meir

OTHER PUBLICATIONS

Search Report of PCT Patent Application WO 2009/118720 A3, Mar. 4, 2010.
Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. 11-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash Eeprom Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT- 28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

ERROR CORRECTION

BACKGROUND OF THE INVENTION

Signature data may be included in a codeword in order to detect errors. The codeword may include a payload section and a redundancy section. The payload may include the data and a Cyclic Redundancy Check (CRC) signature. The redundancy section and the CRC signature provide a certain protection against errors. The data may be deemed valid if the codeword has been successfully reconstructed and the CRC signature matches a CRC value calculated by processing the decoded payload.

Single-dimensional or Multi-dimensional decoding consist of a single/multi code components. In some cases, failures of decoding of the single code/component code may be mitigated when the CRC error detection mechanism detects no errors.

SUMMARY

According to an embodiment of the invention there may be provided a method for employing an estimator to override decoder success indicator, in case a CRC mechanism is employed and the CRC error detection mechanism detects no errors.

According to an embodiment of the invention there may be provided a method for error correction, the method may include receiving a codeword that may include a payload and a redundancy section; error-correction decoding the codeword by applying a syndrome-based error correction process to provide an amended payload and an error-correction decoding success indicator; wherein the amended payload may include an amended payload cyclic redundancy check (CRC) signature and an amended payload data; calculating, using the amended payload CRC signature, a validity of the amended payload to provide a CRC validity result; estimating a number of errors in the redundancy section; and determining that the error-correction succeeded when the number of errors in the redundancy section did not exceed a threshold, the error correction success indicator indicates that the error-correction decoding failed, and the CRC validity result indicates that the amended payload is valid.

The codeword may result from applying at least one error-inducing process on an original codeword; and the estimating of the number of errors in the redundancy section may include calculating a redundancy difference between the redundancy section of the codeword and an original redundancy section of the original codeword.

The calculating of the redundancy difference may include applying multiple Galois field operations.

The calculating of the redundancy difference may include concatenating various terms of a syndrome to provide a first vector; wherein the syndrome is calculated during the applying of the syndrome-based error correction process; and performing a Galois field multiplication between the first vector and a first inverted matrix, the first inverted matrix is calculated by inverting a first matrix that may include powers of Galois field primitive elements, to provide a second vector.

The method may include calculating a number of set bits in the second vector and comparing the number of set bits to the threshold.

The method may include calculating a number of set bits in the second vector and comparing the number of set bits to the threshold if a code error correction capability of the error-correction decoding exceeds one; and calculating a number of set bits in the first vector and comparing the number of set bits to the threshold if a code error correction capability of the error-correction decoding equals one.

The concatenating of the various terms may include concatenating all odd terms of the syndrome.

The codeword may include multiple code components and wherein the error-correction decoding may include error-correction decoding of the multiple code components.

According to an embodiment of the invention there may be provided a non-transitory computer readable medium that stores instructions that once executed by the computer cause the computer to execute the stages of receiving a codeword that may include a payload and a redundancy section; error-correction decoding the codeword by applying a syndrome-based error correction process to provide an amended payload and an error-correction decoding success indicator; wherein the amended payload may include an amended payload cyclic redundancy check (CRC) signature and an amended payload data; calculating, using the amended payload CRC signature, a validity of the amended payload to provide a CRC validity result; estimating a number of errors in the redundancy section; and determining that the error-correction succeeded when the number of errors in the redundancy section did not exceed a threshold, the error correction success indicator indicates that the error-correction decoding failed, and the CRC validity result indicates that the amended payload is valid.

The codeword may result from applying at least one error-inducing process on an original codeword; and the non-transitory computer readable medium may store instructions for calculating a redundancy difference between the redundancy section of the codeword and an original redundancy section of the original codeword.

The non-transitory computer readable medium may store instructions for calculating of the redundancy difference may include by applying multiple Galois field operations.

The non-transitory computer readable medium may store instructions for calculating of the redundancy difference may include by concatenating various terms of a syndrome to provide a first vector; wherein the syndrome is calculated during the applying of the syndrome-based error correction process; and performing a Galois field multiplication between the first vector and a first inverted matrix, the first inverted matrix is calculated by inverting a first matrix that may include powers of Galois field primitive elements, to provide a second vector.

The non-transitory computer readable medium may store instructions for calculating a number of set bits in the second vector and comparing the number of set bits to the threshold.

The non-transitory computer readable medium may store instructions for calculating a number of set bits in the second vector and comparing the number of set bits to the threshold if a code error correction capability of the error-correction decoding exceeds one; and calculating a number of set bits in the first vector and comparing the number of set bits to the threshold if a code error correction capability of the error-correction decoding equals one.

The non-transitory computer readable medium may store instructions for concatenating of the various terms by concatenating all odd terms of the syndrome.

The codeword may include multiple code components and wherein the non-transitory computer readable medium may store instructions for error-correction decoding by error-correction decoding of the multiple code components.

According to an embodiment of the invention there may be provided a device for error correction, the device may include a first error correction decoder that may be arranged to receive a codeword that may include a payload and a redundancy section; error-correction decode the codeword by applying a syndrome-based error correction process to provide an amended payload and an error-correction decoding success indicator; wherein the amended payload may include an amended payload cyclic redundancy check (CRC) signature and an amended payload data; a CRC module that may be arranged to calculate, using the amended payload CRC signature, a validity of the amended payload to provide a CRC validity result; a decision module that may be arranged to estimate a number of errors in the redundancy section; and determine that the error-correction succeeded when the number of errors in the redundancy section did not exceed a threshold, the error correction success indicator indicates that the error-correction decoding failed, and the CRC validity result indicates that the amended payload is valid.

The codeword may result from applying at least one error-inducing process on an original codeword; wherein the decision module may be arranged to estimate of the number of errors in the redundancy section by calculating a redundancy difference between the redundancy section of the codeword and an original redundancy section of the original codeword.

The decision module may be arranged to calculate of the redundancy difference by applying multiple Galois field operations.

The decision module may be arranged to calculate of the redundancy difference by concatenating various terms of a syndrome to provide a first vector; wherein the syndrome is calculated during the applying of the syndrome-based error correction process; and performing a Galois field multiplication between the first vector and a first inverted matrix, the first inverted matrix is calculated by inverting a first matrix that may include powers of Galois field primitive elements to provide a second vector.

The decision module may be arranged to calculate a number of set bits in the second vector and compare the number of set bits to the threshold.

The decision module may be arranged to calculate a number of set bits in the second vector and comparing the number of set bits to the threshold if a code error correction capability of the error-correction decoding exceeds one; and calculate a number of set bits in the first vector and comparing the number of set bits to the threshold if a code error correction capability of the error-correction decoding equals one.

The decision module may be arranged to concatenate the various terms by concatenating all odd terms of the syndrome.

The codeword may include multiple code components and wherein the first error-correction decoder may be arranged to error-correct decoding of the multiple code components.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
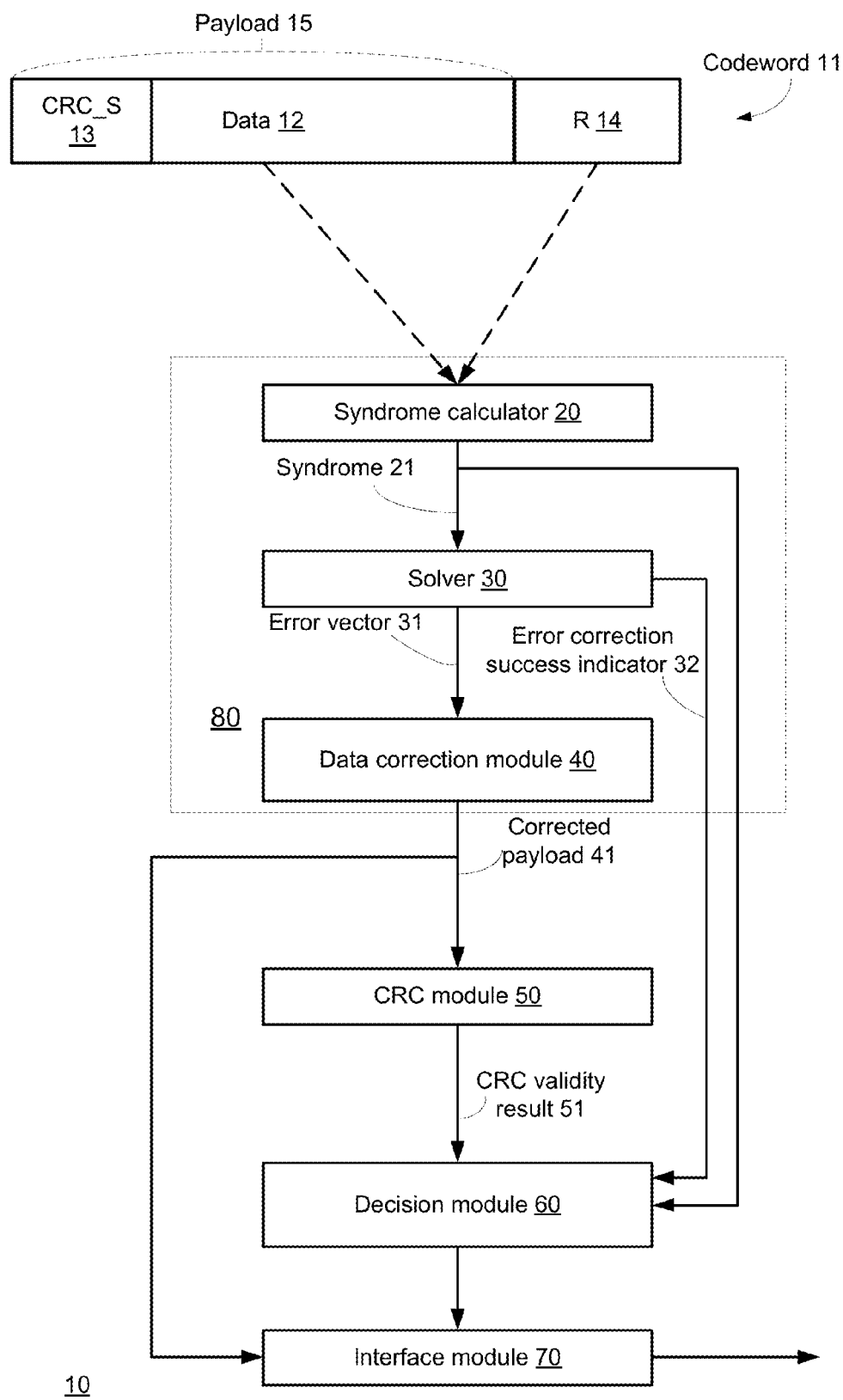
FIG. 1 illustrates a codeword and a device according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

There are provided methods, systems, and computer readable media for error correction.

The methods, systems, and computer readable media may estimate whether a decoding failure originates from errors in the redundancy section only, or from errors in both the payload and the redundancy sections. Thus, if the estimator estimates that the decoding failure originates from errors in the redundancy section only, it may be overridden.

The methods, systems, and computer readable media may be related to any technical field that employs CRC calculations, such as digital communications and data storage and retrieval systems with error correction coding. For example, methods, systems, and computer readable media may perform error correction of code components of multi-dimensional codes.

The methods, systems, and computer readable media estimate the number of errors in the redundancy section of a codeword. The estimation may be based upon the number of set bits in a redundancy difference. This number may be compared to a threshold. If the number of set bits is lower than the threshold then a successful decoding is declared even when miss-correction is reported by a decoder. Thus, overall decoding performance may be improved.

In the following section, it is assumed that the decoding process involves applying mathematical operation over Galois fields that may have a Galois field primitive element of 2 or $2^q$ (2 by the power of q). These fields are denoted as GF(2) and GF($2^q$) respectively.

Syndrome Calculation

Syndrome calculation for the received bits of a component code involves calculation of odd and even terms of a syndrome. The odd terms are calculated by:

$$S_{2j+1} = \sum_{i=1}^{n} b_i \cdot \alpha^{(2j+1)\cdot(n-i)}; 0 \le j \le (t-1)$$

Where t is the code error correction capability, n is the codeword length, $b_i$ is the i'th received bit (index i ranges between 1 and n) and $\alpha$ is the Galois field primitive element.

This equation allows derivation of the odd terms of the syndrome, while the even terms are derived through the following equation:

$$S_{2j+1} = \sum_{i=1}^{n} b_i \cdot \alpha^{(2j+1)\cdot(n-i)} = \left( \sum_{i=1}^{n} b_i \cdot \alpha^{(j+1)\cdot(n-i)} \right)^2 = (s_{2j+1})^2;$$

$$0 \le j \le (t-1)$$

The calculation of the odd terms of the syndrome may be split to summation over k elements of the payload section and over the r=n−k elements of the redundancy section, respectively:

$$S^P_{2j+1} = \sum_{i=1}^{k} b_i \cdot \alpha^{(2j+1)\cdot(n-i)}$$

$$S^R_{2j+1} = \sum_{i=1}^{r} b_{k+i} \cdot \alpha^{(2j+1)\cdot(r-i)}$$

$$s_{2j+1} = s_{2j+1}^P + s_{2j+1}^R$$

Where the addition operation is performed over GF($2^q$). And in a matrix notation:

$$\underline{S}^P = \underline{A}^P \times \underline{p}$$

$$\underline{S}^R = \underline{A}^R \times \underline{r}$$

$$\underline{S} = \underline{S}^P + \underline{S}^R$$

Where $\underline{A}^R$ and $\underline{A}^P$ over GF($2^q$) are given by:

$$\underline{A}^R = \begin{bmatrix} \alpha^{1\times(r-1)} & \alpha^{1\times(r-2)} & \cdots & \alpha^{1\times 0} \\ \alpha^{3\times(r-1)} & \alpha^{3\times(r-2)} & & \alpha^{3\times 0} \\ \vdots & & \ddots & \\ \alpha^{(2t-1)\times(r-1)} & \alpha^{(2t-1)\times(r-2)} & & \alpha^{(2t-1)\times 0} \end{bmatrix}$$

$$\underline{A}^P = \begin{bmatrix} \alpha^{1\times(n-1)} & \alpha^{1\times(n-2)} & \cdots & \alpha^{1\times r} \\ \alpha^{3\times(n-1)} & \alpha^{3\times(n-2)} & & \alpha^{3\times r} \\ \vdots & & \ddots & \\ \alpha^{(2t-1)\times(n-1)} & \alpha^{(2t-1)\times(n-2)} & & \alpha^{(2t-1)\times r} \end{bmatrix}$$

$$\underline{S} = \begin{bmatrix} s_1 \\ s_3 \\ \vdots \\ s_{2t-1} \end{bmatrix}$$

The binary vectors $\underline{P}$ and $\underline{R}$ over GF(2) stand for the payload and redundancy sections of a codeword.

The summation is valid both over GF($2^q$) and over GF(2), with proper translation of the elements from GF($2^q$) to GF(2), by expanding each element over GF($2^q$) to a column of q bits.

Redundancy Estimation for Non-Zero Syndrome

An input sequence is declared error-free when the syndrome vector $\underline{S}$ is an all zero vector.

The syndrome vector equals zero when the when the payload syndrome and the redundancy syndrome are equal ($0=\underline{S}=\underline{S}^P+\underline{S}^R$, wherein adding a number to itself over a Galois field equals zero).

When the decoder declares successful decoding, the corrected input vector, both payload and redundancy, obeys the last of equal payload syndrome and redundancy syndrome.

When the decoder declares unsuccessful decoding, the syndrome vector is non-zero, and the separation to payload syndrome and redundancy syndrome are no longer valid.

In this case, an estimated redundancy vector, which zeroes the payload syndrome, i.e. whose redundancy syndrome is equal to the payload syndrome is defined using $$\underline{\hat{S}}^R = \underline{A}^R \times \underline{r} = \underline{S}^P$$

For clarification it should be denoted that × and + stand for multiplication/addition over GF($2^q$), while ⊗ and ⊕ stand for multiplication/addition over GF(2).

In this case, the estimated redundancy is derived through $$\underline{\hat{r}} = (\underline{A}^R)^{-1} \otimes \underline{S}^P$$

Where $\underline{A}^R$ is converted from GF($2^q$) to GF(2), and all calculations are done over GF(2).

This may provide the following:

$$\underline{\hat{r}} = (\underline{A}^R)^{-1} \otimes (\underline{S} \oplus \underline{S}^R)$$

$$= (\underline{A}^R)^{-1} \otimes (\underline{S} \oplus (\underline{A}^R \otimes \underline{r}))$$

$$= \underline{r} \oplus ((\underline{A}^R)^{-1} \otimes \underline{S})$$

Thus, the difference between the original redundancy and the estimated redundancy is given by:

$$\underline{\Delta r} = \underline{r} \oplus \underline{\hat{r}}$$

$$= \underline{r} \oplus \underline{r} \oplus ((\underline{A}^R)^{-1} \otimes \underline{S})$$

$$= (\underline{A}^R)^{-1} \otimes \underline{S}$$

For a t=1 code, $\underline{A}^R = [\alpha^{q-1} \ \alpha^{q-2} \ldots \alpha^0]$ over $GF(2^q)$, and is translated to the identity matrix over $GF(2)$. Thus, $(\underline{A}^R)^{-1}$ is equal to the identity matrix over $GF(2)$. Therefore, equation [0068] reduces to $\underline{\Delta r} = \underline{S}$.

The metric for determining, whether the errors are in the redundancy section only or also in the payload section, is the number of '1' in $\underline{\Delta r}$ which is also termed a redundancy difference.

$$s = \|\underline{\Delta r}\|$$

This metric is independent of the transmitted data and depends only on the received syndrome, whose calculation is an essential step in the decoding of the received data.

The block diagram for calculating s is illustrated below, based on the details, described in the above.

FIG. 1 illustrates a codeword 11 and a device 10 according to an embodiment of the invention.

Codeword 11 includes payload 15 and redundancy section (R) 14. Payload includes data 12 and CRC signature (CRC_S) 13. The CRC signature may reside anywhere within the payload, and the illustration of the CRC in the beginning of the payload is for illustration purposes only.

Device 10 includes a decoder 80, CRC module 50, decision module 60 and interface module 70.

The decoder 80 includes a syndrome calculator 20, a solver 30 and a data correction module 40.

The decoder 80 is arranged to (a) receive a codeword that includes a payload and a redundancy section; and (b) decode the codeword by applying a syndrome-based decoding process to provide an amended payload and a decoding success indicator. The amended payload includes an amended payload cyclic redundancy check (CRC) signature and an amended payload data.

The syndrome calculator 20 calculates a syndrome (a 2t element vector) 21.

The syndrome 21 is fed to a solver 30 that calculates the location of errors based upon the syndrome 21. The solver 30 outputs an error vector 31 and an error correction success indicator 32.

The CRC module 50 is arranged to calculate, using an amended payload CRC signature, a validity of the amended payload to provide a CRC validity result 51.

The decision module 60 is arranged to:
a. Estimate a number of errors in the redundancy section.
b. Determined, based upon the estimated number of errors in the redundancy section whether all the errors are included in the redundancy section alone or not. The errors are declared as included in the redundancy section alone if the estimated number of errors does not exceed a threshold.
c. Determine that the decoding succeeded when the number of errors in the redundancy section did not exceed the threshold, the decoder success indicator indicates that the decoding failed, and the CRC validity result indicates that the amended payload is valid.
d. Determine that the error-correction succeeded when the decoder success indicator indicates that the decoding succeeded and the CRC validity result indicates that the amended payload is valid.
e. Else-determine that the error-correction failed.

The interface module 70 may be a memory module, a communication channel, a man machine interface, a processor, an output port and the like. It is arranged to output the corrected payload or a portion thereof (for example only the amended data) under the control of the decision module 60.

Figure 2:
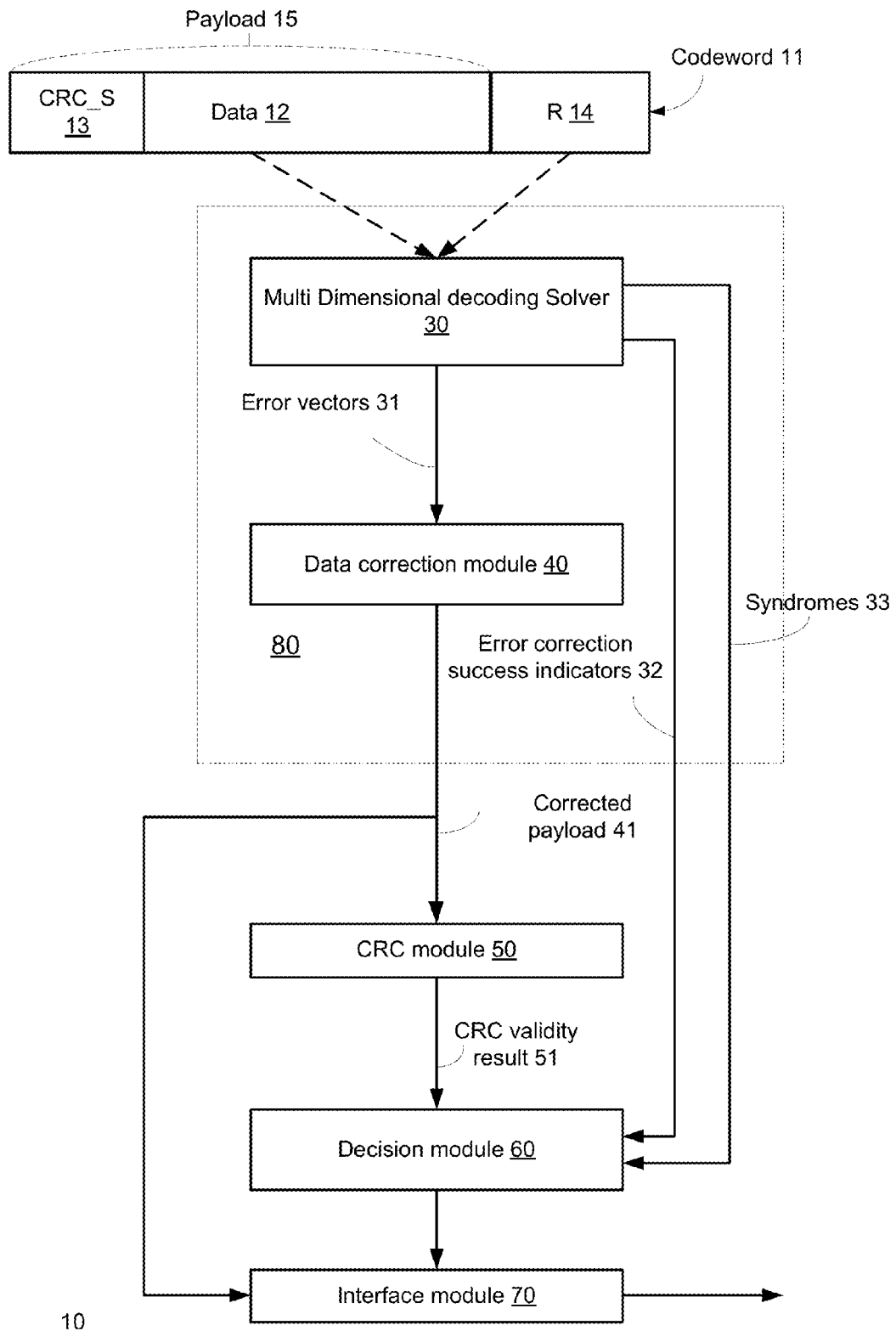
FIG. 2 illustrates a codeword, multiple code components of the codeword and a device according to an embodiment of the invention.

FIG. 2 illustrates a codeword 11, multiple code components of the codeword 11 and a device 10 according to an embodiment of the invention. In FIG. 2 the code is a Multi-Dimensional code, for example, in U.S. Pat. No. 8,510,639 and in U.S. Pat. No. 8,341,502 and US patent application 20100253555 all being incorporated herein by reference. The Multi-Dimensional code, when decoded through standard hard decoding, involves iterations of decoding of the code components.

Upon decoding a failure for any of the code components of the Multi-Dimensional code, all the syndromes belonging to failed decoder success indicators for the code component are gathered. The decision module input comprises of the syndromes of all failed code components.

Device 10 includes a Multi-Dimensional decoder 80, CRC module 50, decision module 60 and interface module 70.

The decoder Multi-Dimensional decoder 80 includes a Multi-Dimensional hard decoding solverer 30 and a data correction module 40, as described in previous inventions.

The Multi-Dimensional decoder 80 is arranged to (a) receive a codeword that includes a payload and a redundancy section; and (b) decode the codeword by applying a Multi-Dimensional syndrome-based decoding process to provide an amended payload, a list of Syndromes corresponding to all component-code packets, and a list of decoding success indicators, corresponding to component-code packets. The amended payload includes an amended payload cyclic redundancy check (CRC) signature and an amended payload data.

The Multi-Dimensional hard decoding solver 30 employs hard decoding to decode the Multi-Dimensional code. The Multi-Dimensional hard decoding solver 30 outputs a list of error vectors 31, a list of error correction success indicators 32 and a list of syndromes 33, corresponding to all component-codes packets in the Multi-Dimensional code The CRC module 50 is arranged to calculate, using an amended payload CRC signature, a validity of the amended payload to provide a CRC validity result 51.

The decision module 60 is arranged to:
a. Estimate a number of errors in the redundancy section from all component codes.
b. Determined, based upon the estimated number of errors in the redundancy section whether all the errors are included in the redundancy section alone or not. The errors are declared as included in the redundancy section alone if the estimated number of errors does not exceed a threshold.
c. Determine that the decoding succeeded when the number of errors in the redundancy section did not exceed the threshold, the decoder success indicators for non-zero number of component codes indicates that the decoding failed, and the CRC validity result indicates that the amended payload is valid.
d. Determine that the error-correction succeeded when the decoder success indicators for all component codes indicate that the decoding succeeded and the CRC validity result indicates that the amended payload is valid.

e. Else-determine that the error-correction failed.

The interface module 70 may be a memory module, a communication channel, a man machine interface, a processor, an output port and the like. It is arranged to output the corrected payload or a portion thereof (for example only the amended data) under the control of the decision module 60.

Figure 3:
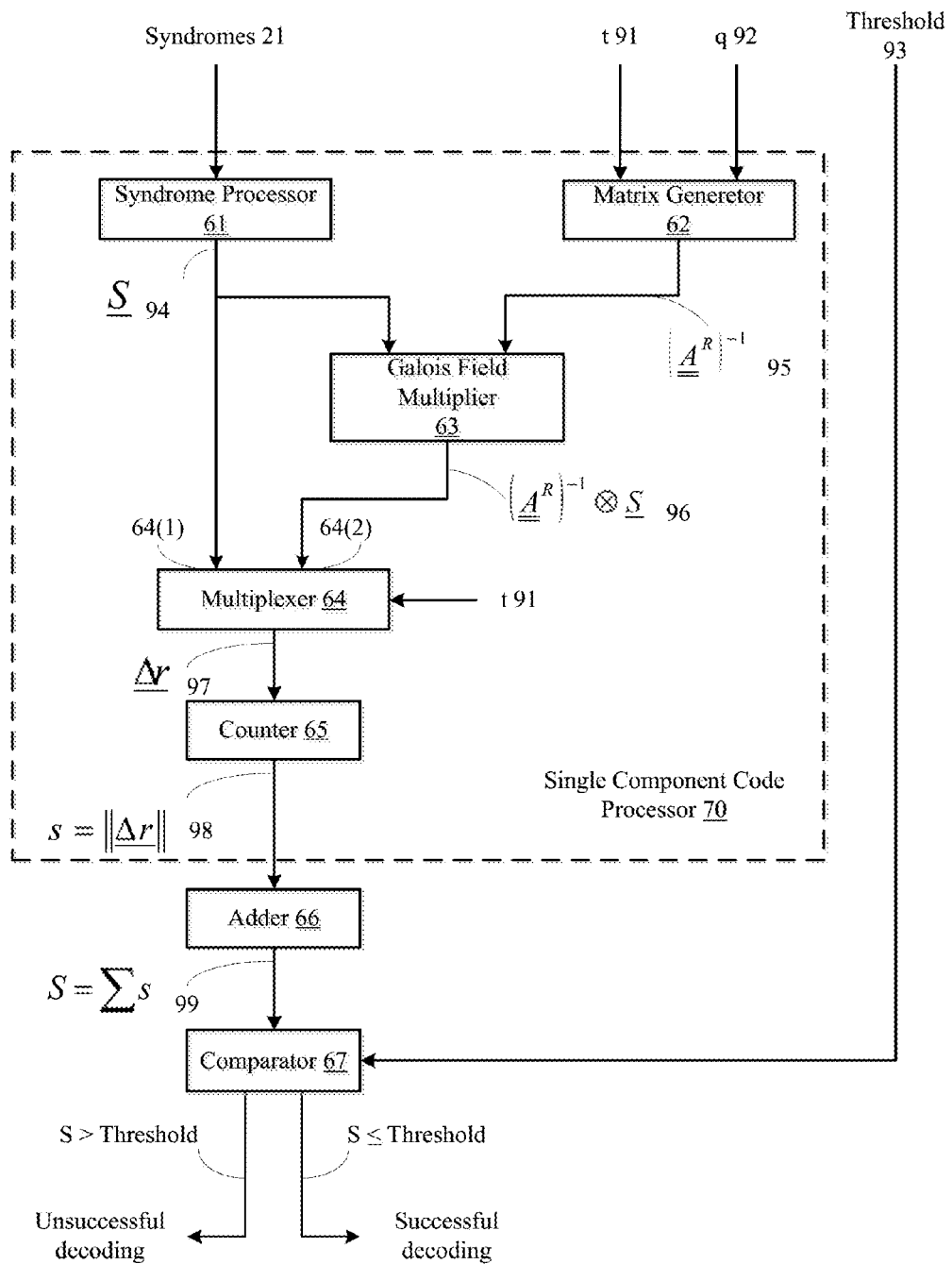
FIG. 3 illustrates a decision module of the device of FIG. 1 and of FIG. 2 according to an embodiment of the invention.

FIG. 3 illustrates a decision module 60 of device 10 of FIGS. 1 and 2 according to an embodiment of the invention.

The decision module 60 includes a single component code processor 70, an added 66, and a comparator 67.

The single component code processor 70 consists of a syndrome processor 61, a matrix generator 62, a Galois field multiplier 63, a multiplexer 64, and a counter 65.

The syndrome processor 61 is arranged to receive the syndrome from a single component code 21 and output a first vector S 94. The processing may include concatenating various terms (for example all odd terms) of syndrome 21.

The matrix generator 62 is arranged to output the $(\underline{A}^R)^{-1}$ matrix 95, calculated by inverting a first matrix $\underline{A}^R$ that includes powers of Galois field primitive elements, determined from code correction capability t and field size q.

The Galois field multiplier 63 is arranged to perform a Galois field GF(2) multiplication between the first vector ($\underline{S}$) 94 and a first inverted matrix $(\underline{A}^R)^{-1}$ 95 to provide a second vector 96.

The first vector $\underline{S}$ 94 and the second vector 96 are fed to first and second inputs 64(1) and 64(2) respectively of multiplexer 64.

Multiplexer 64 receives t and selects to output the first vector $\underline{S}$ 94 if t=1 and to output the second vector 96 if t exceeds one. The value outputted by the multiplexer 64 is denoted $\underline{\Delta r}$ 97 and represents a redundancy difference between the redundancy section of the codeword and an original redundancy section of an original codeword from which the codeword originated.

If t exceeds one then the redundancy difference ($\underline{\Delta r}$) is the second vector and if t=1 the redundancy difference ($\underline{\Delta r}$) is the first vector.

Counter 65 counts the number of set bits ('1') in the redundancy difference ($\underline{\Delta r}$) 97 of a single component code, to denoted as s 98.

Adder 66 sums the redundancy differences s 98 from all code components, who's error correction success indicator is false, to output the sum of all redundancy differences S 99.

Comparator 67 compares the number of set bits from all the redundancy differences to threshold 93. Variable S 99 represents the number of set bits in all of the redundancy differences, from all code components, who's error correction success indicator is false.

If the number of set bits (s) exceeds the threshold then determining that the error-correction failed and if it (s) did not exceed the threshold then determining that the error-correction succeeded.

The threshold may be set in response to the distributions of different values of the number of set bits of the redundancy difference for different number of errors in the redundancy section.

The threshold may be set in order to differentiate between a case in which all errors are included in the redundancy section and between a case where one or more errors occur in the payload.

Figure 4:
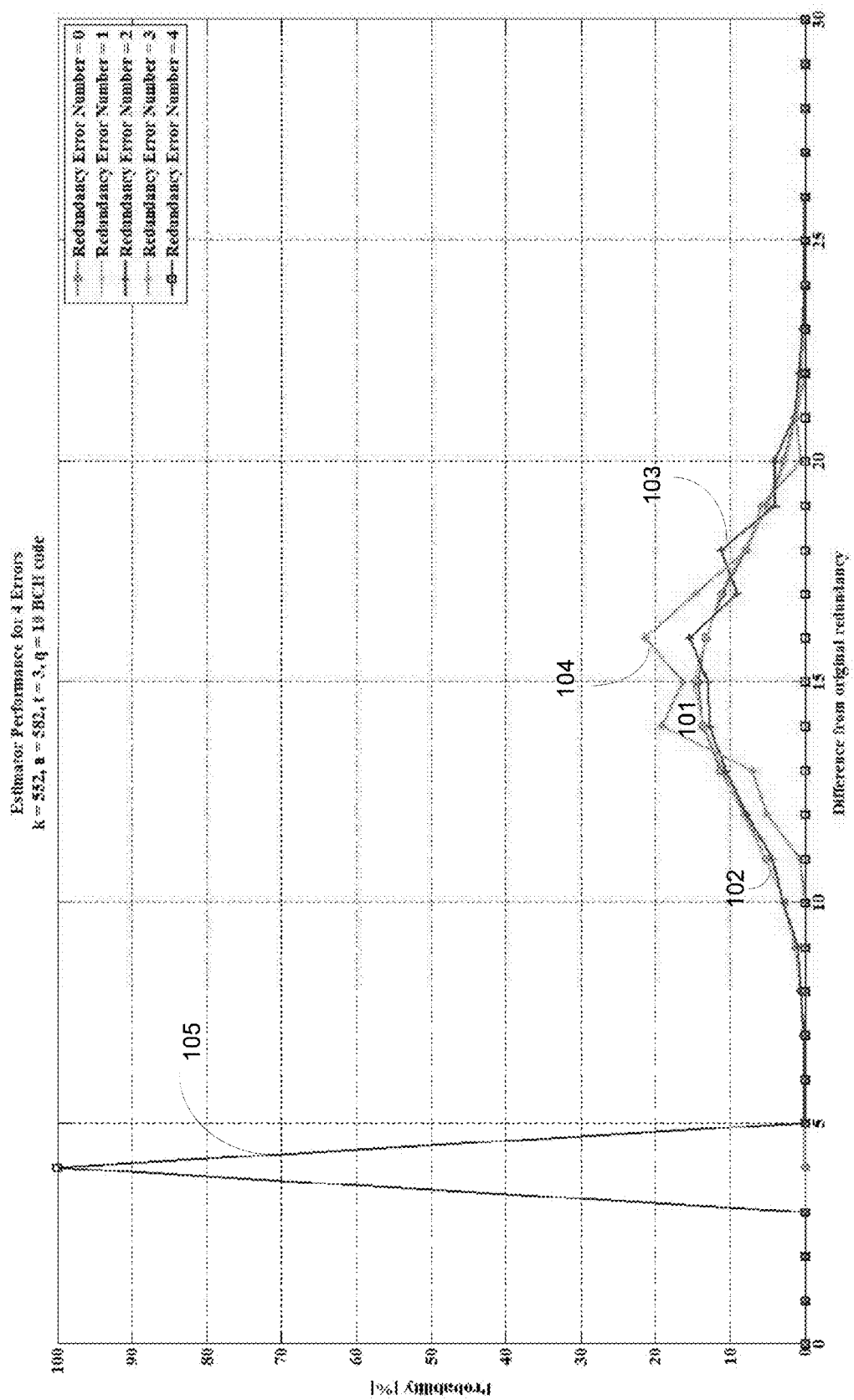
FIG. 4 illustrates various distributions of numbers of set bits of the redundancy difference for different number of errors in the redundancy section according to an embodiment of the invention.

FIG. 4 illustrates various distributions of numbers of set bits of the redundancy difference for different number of errors in the redundancy section according to an embodiment of the invention.

The x-axis of graph 100 of FIG. 4 shows values of the number of set bits of redundancy difference ($\underline{\Delta r}$) for five different scanarios—a first scenario (curve 105) in which all 4 errors are included in the redundancy section, a second scenario (curve 104) in which 3 out of 4 errors are included in the redundancy section, a third scenario (curve 103) in which 2 out of 4 errors are included in the redundancy section, a fourth scenario (curve 102) in which 1 out of 4 errors are included in the redundancy section and a fifth scenario (curve 101) in which 0 out of 4 errors are included in the redundancy section.

Curve 105 has sharp peak at four set bits of $\underline{\Delta r}$. This peak is spaced apart from the lobes of curves 101-104.

Setting a threshold between the peak of curve 105 and the lobes of curves 101-1-4 ($\underline{\Delta r}$ values of 5-7) may provide a differentiation between a case in which all errors are included in the redundancy section and a case where one or more errors occur in the payload.

Figure 5:
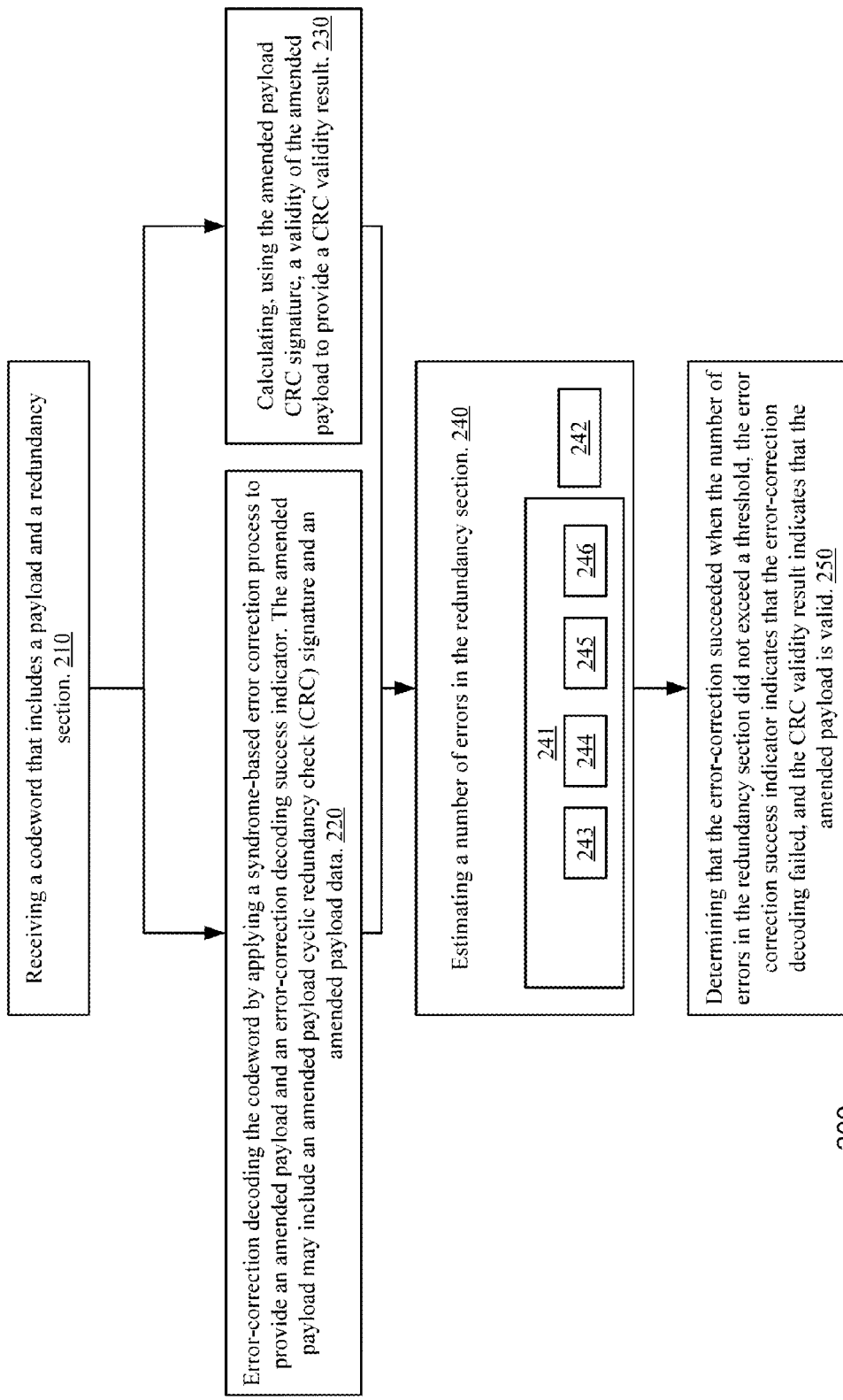
FIG. 5 illustrates a method according to an embodiment of the invention.

FIG. 5 illustrates a method 200 according to an embodiment of the invention.

Method 200 may start by stage 210 of receiving a codeword that includes a payload and a redundancy section.

Stage 210 may be followed by stage 220 of error-correction decoding the codeword by applying a syndrome-based error correction process to provide an amended payload and an error-correction decoding success indicator. The amended payload may include an amended payload cyclic redundancy check (CRC) signature and an amended payload data.

The codeword may include multiple code components and stage 220 may include error-correction decoding of the multiple code components.

Stage 220 may be followed by stage 230 of calculating, using the amended payload CRC signature, and a validity of the amended payload to provide a CRC validity result.

Stage 220 may also be followed by stage 240 of estimating a number of errors in the redundancy section.

The codeword may result from applying at least one error-inducing process on an original codeword.

Stage 240 may include calculating 241 a total redundancy difference between the redundancy section of the codeword and an original redundancy section of the original codeword. The calculating of the redundancy difference may include applying multiple Galois field operations. Stage 240 may also include stage 242 of comparing the redundancy difference to a threshold.

Stage 241 may include:
a. Concatenating (243) various terms of a syndrome to provide a first vector. The syndrome is calculated during the applying of the syndrome-based error correction process.
b. Performing (244) a Galois field multiplication between the first vector and a first inverted matrix, the first inverted matrix is calculated by inverting a first matrix that comprises powers of Galois field primitive elements, to provide a second vector.
c. Calculating (245) a number of set bits in the second vector.

According to an embodiment of the invention stages 243, 244 and 245 may be executed if t exceeds one. Else, stage 241 may include calculating (246) a number of set bits in the first vector. Stage 242 may include comparing the number of set bits to the threshold.

The concatenating (242) of the various terms may include concatenating all odd terms of the syndrome.

Stages 230 and 240 may be followed by stage 250 of determining that the error-correction succeeded when the number of errors in the redundancy section did not exceed a threshold, the error correction success indicator indicates that the error-correction decoding failed, and the CRC validity result indicates that the amended payload is valid.

Detector Performance Estimation

If all $N_e$ errors reside in the redundancy section, the estimator is fully capable of deriving the true redundancy, and the discrepancy in the number of ones is exactly $N_e$.

If a non-zero number of errors reside in the payload section, it is impossible to restore the true redundancy, and the discrepancy in the number of ones is distributed following a Binomial distribution between 0 and r, $$s \sim B\left(r, \frac{1}{2}\right).$$

Thus, estimator is equivalent to a detector between two hypotheses:
$H_o$: All errors reside in redundancy
$H_1 \sim H_0$ The total number of errors is defined as $N_e$, which follows a Binomial distribution: $N_e \sim B(n,p)$ Where p is the probability of error per bit.

The analytical probability density functions of s given the two hypotheses are:

$$P(s = u | H_0) = \binom{r}{u} \times p^u \times (1-p)^{n-u};$$

$t < u \leq r$ $$P(s = u | H_1) = \binom{r}{u} \times \frac{1}{2^r} \times \left(1 - P_{Success} - \sum_{v=t+1}^{r} \binom{r}{v} \times p^v \times (1-p)^{n-v}\right);$$

$0 \leq u \leq r$

Where $P_{Success}$ is the probability of having up to t errors:

$$P_{Success} = \sum_{u=0}^{t} \binom{n}{u} \times p^u \times (1-p)^{n-u}$$

Detector analytic performance was derived for several BCH codes over $GF(2^{10})$: t=1, k=552, n=562; t=2, k=552, n=572 and t=3, k=552, n=582.

Setting a threshold for determining between $H_o$ and $H_1$, following:

$r \leq T: H_0$ $r > T: H_1$

Figure 6:
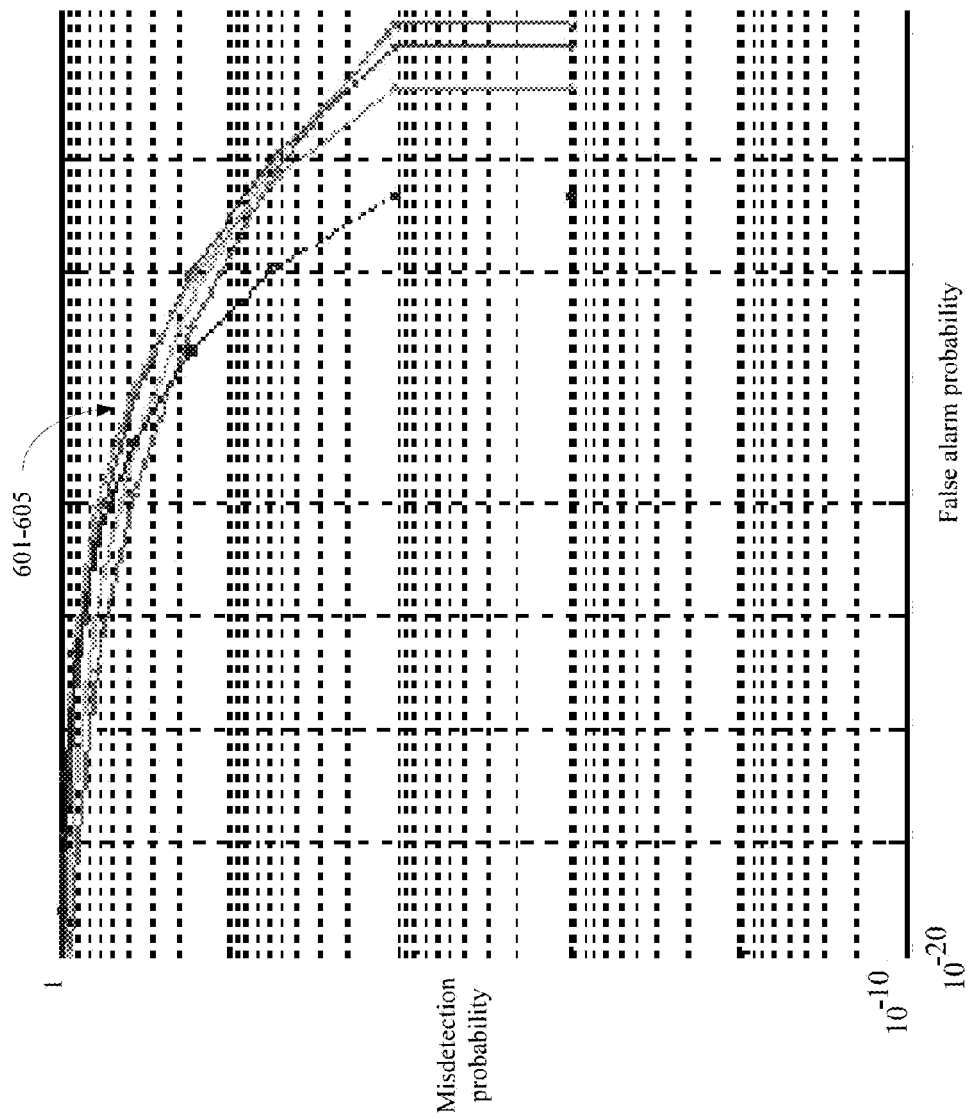
FIGS. 6-8 illustrate various receiver operating characteristic (ROC) graphs according to various embodiments of the invention.
Figure 7:
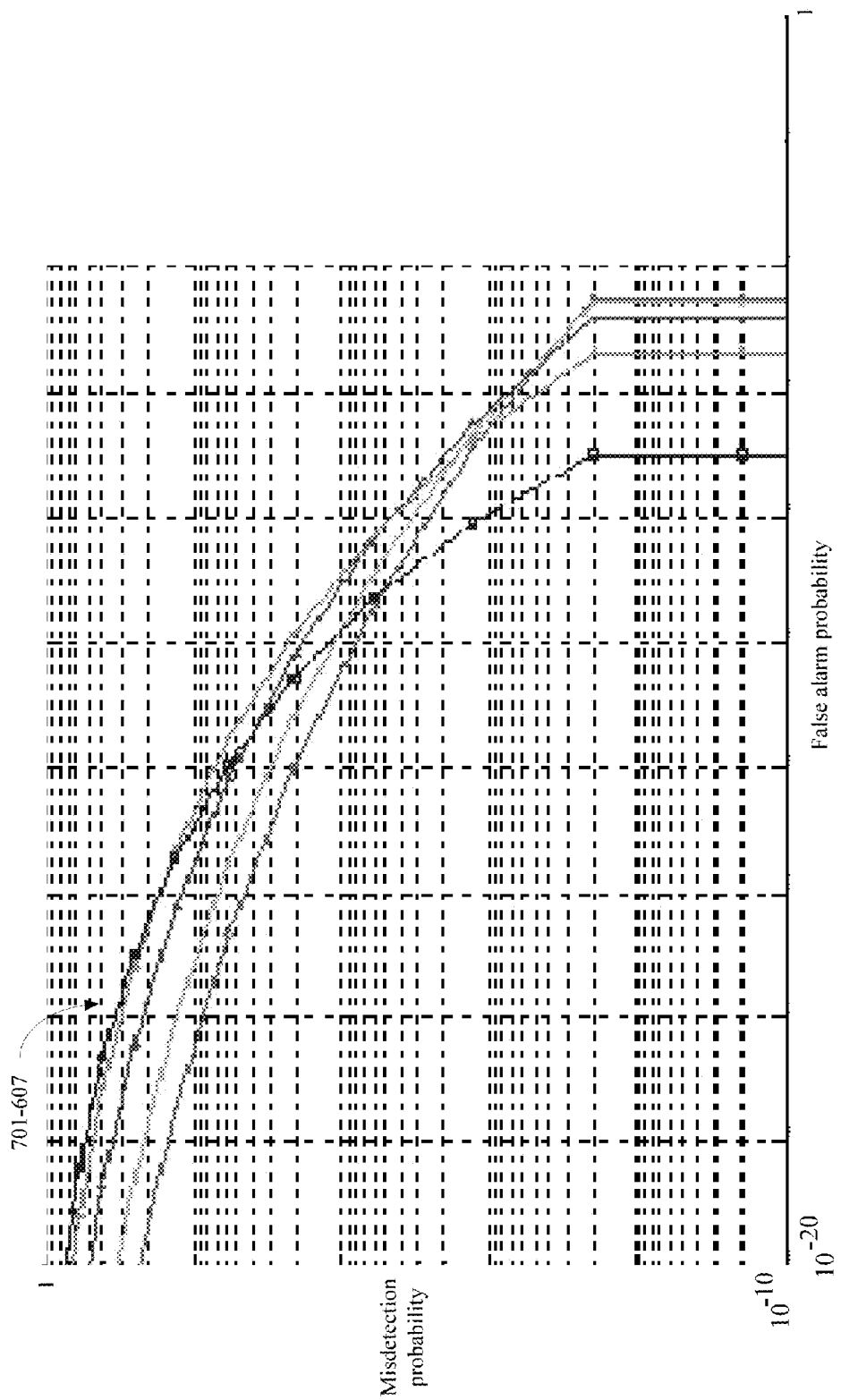
Figure 8:
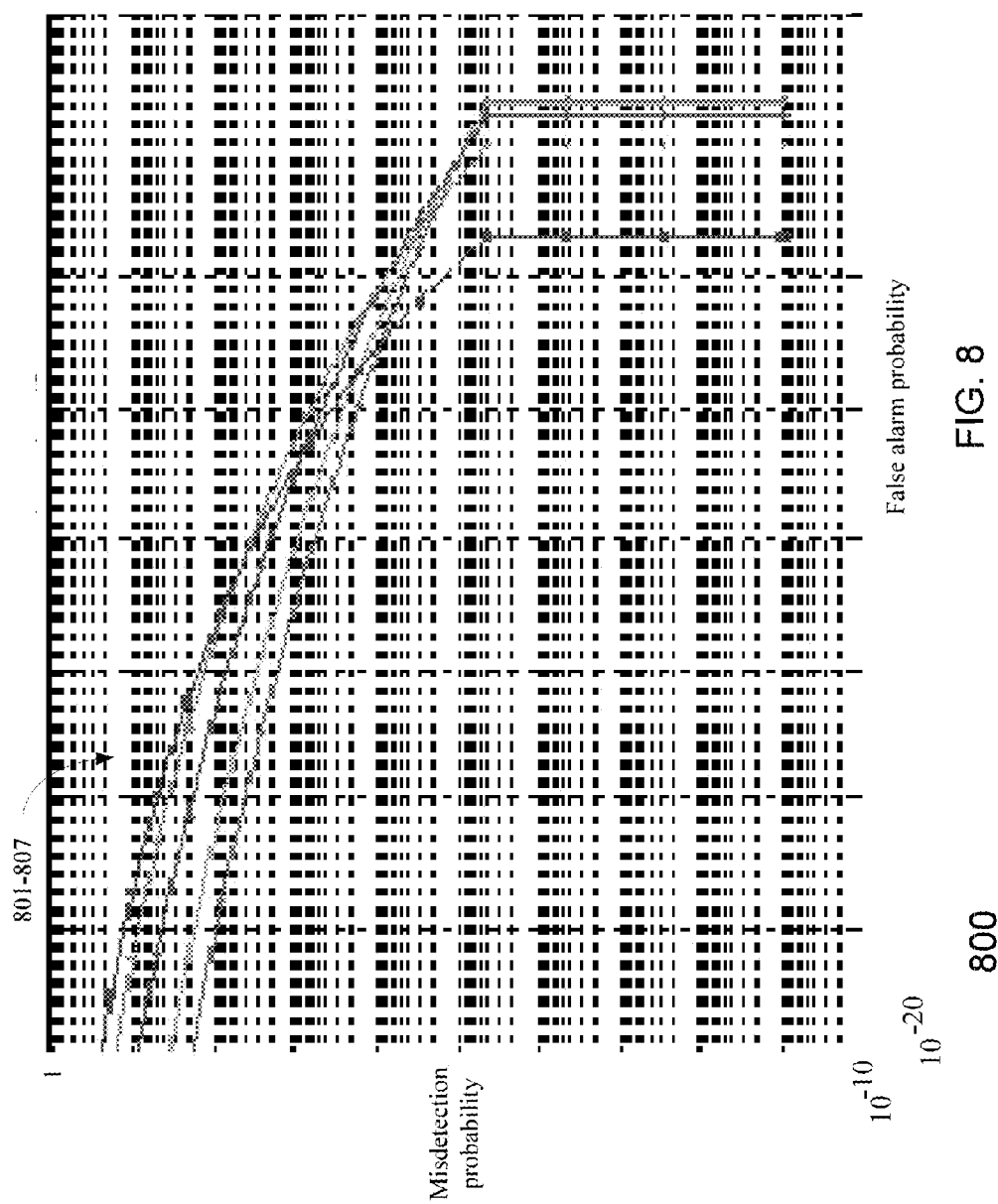

This statistics allows defining false-alarm and miss-detection rates and the ROC curve of the detector, illustrated in FIGS. 6-8.

FIG. 6 illustrates five curves 601-604 for a decoder having t=1 and for Pe values of 0.001, 0.002, 0.005, 0.01 and 0.2 respectively.

FIG. 7 illustrates five curves 701-704 for a decoder having t=2 and for Pe values of 0.001, 0.002, 0.005, 0.01 and 0.2 respectively.

FIG. 8 illustrates five curves 801-804 for a decoder having t=2 and for Pe values of 0.001, 0.002, 0.005, 0.01 and 0.2 respectively.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. In addition, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. In addition, if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for error correction, the method comprises:
   receiving a codeword that comprises a payload and a redundancy section;
   error-correction decoding the codeword, by a decoder that comprises a syndrome calculator, a solver and a data correction module, by applying a syndrome-based error correction process to provide an amended payload and an error-correction decoding success indicator;
   wherein the error-correction decoding success indicator is generated by the solver; wherein the amended payload comprises an amended payload cyclic redundancy check (CRC) signature and an amended payload data;

calculating, by a CRC module and using the amended payload CRC signature, a validity of the amended payload to provide a CRC validity result;

estimating, by a decision module, a number of errors in the redundancy section; and determining, by the decision module, that the error-correction succeeded when the number of errors in the redundancy section did not exceed a threshold, the error correction success indicator indicates that the error-correction decoding failed, and the CRC validity result indicates that the amended payload is valid.

2. The method according to claim 1, comprising receiving an original redundancy section of an original codeword; wherein the codeword is calculated by applying at least one error-inducing process on the original codeword;

wherein the estimating of the number of errors in the redundancy section comprising calculating a redundancy difference between the redundancy section of the codeword and the original redundancy section of the original codeword.

3. The method according to claim 2 wherein the calculating of the redundancy difference comprises applying multiple Galois field operations.

4. The method according to claim 2 wherein the calculating of the redundancy difference comprises:

concatenating various terms of a syndrome to provide a first vector; wherein the syndrome is calculated during the applying of the syndrome-based error correction process; and performing a Galois field multiplication between the first vector and a first inverted matrix, the first inverted matrix is calculated by inverting a first matrix that comprises powers of Galois field primitive elements, to provide a second vector.

5. The method according to claim 4, comprising calculating a number of set bits in the second vector and comparing the number of set bits to the threshold.

6. The method according to claim 4, comprising:

calculating a number of set bits in the second vector and comparing the number of set bits to the threshold if a code error correction capability of the error-correction decoding exceeds one; and calculating a number of set bits in the first vector and comparing the number of set bits to the threshold if a code error correction capability of the error-correction decoding equals one.

7. The method according to claim 4 wherein the concatenating of the various terms comprises concatenating all odd terms of the syndrome.

8. The method according to claim 1 wherein the codeword comprises multiple code components and wherein the error-correction decoding comprises error-correction decoding of all multiple code components.

9. A non-transitory computer readable medium that stores instructions that once executed by the computer cause the computer to execute the stages of:

receiving a codeword that comprises a payload and a redundancy section;

error-correction decoding the codeword, by a decoder that belongs to the computer and comprises a syndrome calculator, a solver and a data correction module and by applying a syndrome-based error correction process to provide an amended payload and an error-correction decoding success indicator; wherein the error-correction decoding success indicator is generated by the solver; wherein the amended payload comprises an amended payload cyclic redundancy check (CRC) signature and an amended payload data;

calculating, by a CRC module and using the amended payload CRC signature, a validity of the amended payload to provide a CRC validity result;

estimating, by a decision module, a number of errors in the redundancy section; and determining, by the decision module, that the error-correction succeeded when the number of errors in the redundancy section did not exceed a threshold, the error correction success indicator indicates that the error-correction decoding failed, and the CRC validity result indicates that the amended payload is valid.

10. The non-transitory computer readable medium according to claim 9 wherein codeword results from applying at least one error-inducing process on an original codeword; and wherein the non-transitory computer readable medium stores instructions for calculating a redundancy difference between the redundancy section of the codeword and an original redundancy section of the original codeword.

11. The non-transitory computer readable medium according to claim 10 that stores instructions for calculating of the redundancy difference comprises by applying multiple Galois field operations.

12. The non-transitory computer readable medium according to claim 10 that stores instructions for calculating of the redundancy difference comprises by: concatenating various terms of a syndrome to provide a first vector; wherein the syndrome is calculated during the applying of the syndrome-based error correction process; and performing a Galois field multiplication between the first vector and a first inverted matrix, the first inverted matrix is calculated by inverting a first matrix that comprises powers of Galois field primitive elements, to provide a second vector.

13. The non-transitory computer readable medium according to claim 12 that stores instructions for calculating a number of set bits in the second vector and comparing the number of set bits to the threshold.

14. The non-transitory computer readable medium according to claim 12 that stores instructions for calculating a number of set bits in the second vector and comparing the number of set bits to the threshold if a code error correction capability of the error-correction decoding exceeds one; and calculating a number of set bits in the first vector and comparing the number of set bits to the threshold if a code error correction capability of the error-correction decoding equals one.

15. The non-transitory computer readable medium according to claim 12 that stores instructions for concatenating of the various terms by concatenating all odd terms of the syndrome.

16. The non-transitory computer readable medium according to claim 9 wherein the codeword comprises multiple code components and wherein the non-transitory computer readable medium stores instructions for error-correction decoding by error-correction decoding of the multiple code components.

17. A device for error correction, the device comprises:

a first error correction decoder that comprises a syndrome calculator, a solver and a data correction module and is arranged to:

receive a codeword that comprises a payload and a redundancy section;

error-correction decode the codeword by applying a syndrome-based error correction process to provide an amended payload and an error-correction decoding success indicator; wherein the amended payload comprises an amended payload cyclic redundancy check (CRC) signature and an amended payload data; wherein the error-correction decoding success indicator is generated by the solver;

a CRC module that is arranged to calculate, using the amended payload CRC signature, a validity of the amended payload to provide a CRC validity result; and a decision module that is arranged to:

estimate a number of errors in the redundancy section; and determine that the error-correction succeeded when the number of errors in the redundancy section did not exceed a threshold, the error correction success indicator indicates that the error-correction decoding failed, and the CRC validity result indicates that the amended payload is valid.

18. The device according to claim 17 wherein codeword results from applying at least one error-inducing process on an original codeword; wherein the decision module is arranged to estimate of the number of errors in the redundancy section by calculating a redundancy difference between the redundancy section of the codeword and an original redundancy section of the original codeword.

19. The device according to claim 18 wherein the decision module is arranged to calculate of the redundancy difference by applying multiple Galois field operations.

20. The device according to claim 18 wherein the decision module is arranged to calculate of the redundancy difference by concatenating various terms of a syndrome to provide a first vector; wherein the syndrome is calculated during the applying of the syndrome-based error correction process; and performing a Galois field multiplication between the first vector and a first inverted matrix, the first inverted matrix is calculated by inverting a first matrix that comprises powers of Galois field primitive elements to provide a second vector.

21. The device according to claim 20 wherein the decision module is arranged to calculate a number of set bits in the second vector and compare the number of set bits to the threshold.

22. The device according to claim 20, wherein the decision module is arranged to calculate a number of set bits in the second vector and comparing the number of set bits to the threshold if a code error correction capability of the error-correction decoding exceeds one; and calculate a number of set bits in the first vector and comparing the number of set bits to the threshold if a code error correction capability of the error-correction decoding equals one.

23. The device according to claim 20 wherein the decision module is arranged to concatenate the various terms by concatenating all odd terms of the syndrome.

24. The device according to claim 17 wherein the codeword comprises multiple code components and wherein the first error-correction decoder is arranged to error-correct decoding of the multiple code components.

25. The device according to claim 17 wherein the decision module comprises a syndrome processor, a matrix generator, and a Galois Field multiplier; wherein the syndrome processor is configured to receive one or more syndromes from the solver and to generate a first vector; wherein the matrix generator is configured to generate an inverted matrix by inverting a matrix that includes powers of Galois field primitive elements, determined from a code correction capability parameter and a Galois field size parameter; and wherein the Galois Field multiplier is configured to multiply the inverted matrix by the first vector.

* * * * *